United States Patent
Ahlers et al.

(10) Patent No.: US 11,955,974 B2
(45) Date of Patent: Apr. 9, 2024

(54) DUAL GATE MOSFET DEVICES AND PRE-CHARGING TECHNIQUES FOR DC LINK CAPACITORS

(71) Applicant: Infineon Technologies AG, Neubiberg (DE)

(72) Inventors: Dirk Ahlers, Munich (DE); Manuel Wilke, Berlin (DE); Benjamin Schmidt, Munich (DE); Jonas Groenvall, Dietramszell (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/810,163

(22) Filed: Jun. 30, 2022

(65) Prior Publication Data

US 2024/0007084 A1    Jan. 4, 2024

(51) Int. Cl.
*H03K 3/011* (2006.01)
*H03K 17/687* (2006.01)

(52) U.S. Cl.
CPC .......... *H03K 3/011* (2013.01); *H03K 17/6871* (2013.01)

(58) Field of Classification Search
CPC .................... H03K 3/011; H03K 17/6871
See application file for complete search history.

(56) References Cited

U.S. PATENT DOCUMENTS

2011/0316489 A1* 12/2011 Norimatsu .............. H02M 1/36
 320/166
2018/0012662 A1* 1/2018 Shin ....................... G11C 7/067

FOREIGN PATENT DOCUMENTS

CN        112234104 A  *  1/2021    ......... G05B 19/0423

* cited by examiner

*Primary Examiner* — Metasebia T Retebo
(74) *Attorney, Agent, or Firm* — Shumaker & Sieffert, P.A.

(57) ABSTRACT

This disclosure is directed to a dual gate metal oxide semiconductor field effect transistor (MOSFET) device formed in a semiconductor material, as well as circuits and techniques for using the dual gate MOSFET device. In some examples, the dual gate MOSFET device may comprise a first MOSFET formed in the semiconductor material, and a second MOSFET formed in the semiconductor material, wherein the first MOSFET and the second MOSFET are arranged in parallel in the semiconductor material, wherein the first MOSFET and the second MOSFET include a common drain node and a common source node, and wherein the first MOSFET and the second MOSFET define different transfer characteristics.

23 Claims, 7 Drawing Sheets

US 11,955,974 B2

DUAL GATE MOSFET DEVICES AND PRE-CHARGING TECHNIQUES FOR DC LINK CAPACITORS

TECHNICAL FIELD

This disclosure relates to transistors that may be used as disconnect switches, and more specifically, metal-oxide semiconductor field effect transistors (MOSFETs).

BACKGROUND

Power switches are used in a wide variety of applications in order to control power being delivered to a load. Metal-Oxide Field Effect Transistors (MOSFETs) are often used as power switches. MOSFETs may be formed in silicon (Si), gallium nitride (GaN), silicon carbide (SiC), or another semiconductor material. Examples of MOSFETs may include, but are not limited to, PMOS, NMOS, DMOS, or any other type of MOSFET, or any combination of the same.

Power switches are typically controlled by one or more driver circuits via a voltage signal applied to the gate of a power switch so as to control on/off switching of the power switch. A microcontroller may provide control signals to the driver circuit(s) to provide system-level control over the power switches.

SUMMARY

This disclosure is directed to a dual gate metal oxide semiconductor field effect transistor (MOSFET) device formed in a semiconductor material, as well as circuits and techniques for using the dual gate MOSFET device. The dual gate MOSFET device comprises two separate transistors formed in the same semiconductor material. The two separate transistors are arranged in parallel in the device, and the two separate transistors share a common source node and a common drain node in the semiconductor material. Moreover, the two separate transistors are different types of transistors configured for different functional operations. Accordingly, separate gate pins of the device may be used to control the two separate transistors. In some examples, a first transistor of the device is configured to operate in a linear mode of operation (e.g., current limited operation) and may be used for a pre-charging routine used for pre-charging a direct current (DC) link capacitor, such as in an electric vehicle or another high-voltage battery operated system. A second transistor of the device may be configured to operate in a non-linear mode of operation and may be used to define a highly conductive current path during an ON state of the second transistor, which may immediately follow the pre-charging routine performed using the first capacitor.

In some examples, this disclosure describes a device that comprises a first MOSFET formed in a semiconductor material; a second MOSFET formed in the semiconductor material, wherein the first MOSFET and the second MOSFET are arranged in parallel in the semiconductor material; a first gate pin associated with the first MOSFET, wherein the first gate pin is connected to a gate node of the first MOSFET; a second gate pin associated with the second MOSFET, wherein the second gate pin is connected to a gate node of the second MOSFET; one or more drain conductors connected to a drain node of the first MOSFET and connected to a drain node of the second MOSFET, wherein the drain node of the first MOSFET and the drain node of the second MOSFET comprise a common drain node in the semiconductor material; and one or more source conductors connected to a source node of the first MOSFET and connected to a source node of the second MOSFET, wherein the source node of the first MOSFET and the source node of the second MOSFET comprise a common source node in the semiconductor material, wherein the first MOSFET and the second MOSFET define different transfer characteristics.

In some examples, this disclosure describes a circuit comprising: a dual gate MOSFET device formed in a semiconductor material, the dual gate MOSFET device including a first MOSFET formed in the semiconductor material, and a second MOSFET formed in the semiconductor material, wherein the first MOSFET and the second MOSFET are arranged in parallel in the semiconductor material, wherein the first MOSFET and the second MOSFET include a common drain node and a common source node, and wherein the first MOSFET and the second MOSFET define different transfer characteristics; and one or more driver circuits configured to control the first MOSFET and the second MOSFET based on gate voltage signals.

In some examples, this disclosure describes a method that comprises controlling a dual gate MOSFET device formed in a semiconductor material, the dual gate MOSFET device including a first MOSFET formed in the semiconductor material, and a second MOSFET formed in the semiconductor material, wherein the first MOSFET and the second MOSFET are arranged in parallel in the semiconductor material, wherein the first MOSFET and the second MOSFET include a common drain node and a common source node, and wherein the first MOSFET and the second MOSFET define different transfer characteristics.

Details of these and other examples are set forth in the accompanying drawings and the description below. Other features, objects, and advantages will be apparent from the description and drawings, and from the claims.

DETAILED DESCRIPTION

This disclosure is directed to a dual gate metal oxide semiconductor field effect transistor (MOSFET) device formed in a semiconductor material, as well as circuits and techniques for using the dual gate MOSFET device. The dual gate MOSFET device comprises two separate transistors formed in the same semiconductor material. The two separate transistors are arranged in parallel in the device, and the two separate transistors share a common source node and a common drain node in the semiconductor material.

The two separate transistors of the dual gate MOSFET device may comprise different types of transistors configured for different functional operations. Separate gate pins of the device may be used to control the two separate transistors. For example, a first transistor of the device is configured to operate in a linear mode of operation (e.g., a current limited operation), and a second transistor of the device may be configured to operate in a non-linear mode of operation (e.g., at low conduction losses). The two different transistors may define different transfer characteristics and different safe operating areas (SOAs). Moreover, the two different transistors may define different Zero Temperature Coefficients (ZTCs).

As described in greater detail below, in some examples, a first transistor of the dual gate MOSFET device may be used for a pre-charging routine used for pre-charging a direct current (DC) link capacitor, such as a DC link capacitor of an electric vehicle or another high-voltage battery operated system. A second transistor of the device may be configured to operate in a non-linear mode of operation and may be used to define a highly conductive current path during an ON state of the second transistor, which may immediately follow the pre-charging routine performed using the first capacitor.

Figure 1:
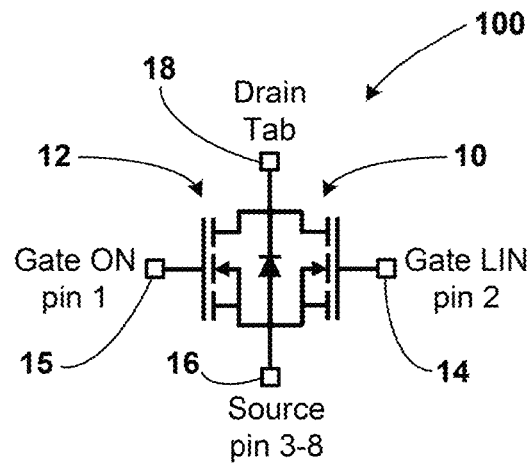
FIG. 1 is a circuit diagram showing an example dual gate MOSFET device consistent with this disclosure.

FIG. 1 is a circuit diagram showing an example dual gate MOSFET device 100 consistent with this disclosure. Device 100 shown in FIG. 1 comprises a first MOSFET 10 formed in a semiconductor material and a second MOSFET 12 formed in the same semiconductor material. As shown in FIG. 1, first MOSFET 10 and second MOSFET 12 are arranged in parallel in the semiconductor material. For example, the current paths through first MOSFET 10 and second MOSFET 12 define parallel current paths through the device, although as explained in greater detail below, in some examples, the two different current paths may not be used simultaneously. The device shown in FIG. 1 includes a first gate pin 14 associated with first MOSFET 10, wherein first gate pin 14 is connected to a gate node of first MOSFET 10. Device 100 further includes a second gate pin 15 associated with second MOSFET 12, wherein second gate pin 15 is connected to a gate node of second MOSFET 12.

In device 100 of FIG. 1, one or more drain conductors, such as drain tab 18, are connected to a drain node of first MOSFET 10 and connected to a drain node of the second MOSFET 12. In other words, the drain node of first MOSFET 10 and the drain node of second MOSFET 12 comprise a common drain node in the semiconductor material, which is connected to drain tab 18. Similarly, in the device 100, one or more source conductors, e.g., source pin(s) 16, are connected to a source node of first MOSFET 10 and connected to a source node of second MOSFET 12. In other words, the source node of first MOSFET 10 and the source node of second MOSFET 12 comprise a common source node in the semiconductor material, which is connected to source pin(s) 16.

According to this disclosure, first MOSFET 10 and second MOSFET 12 define different transfer characteristics. For example, first MOSFET 10 may be configured to operate in a linear mode of operation, and a second MOSFET 12 may be configured to operate in a non-linear mode of operation. In some examples, first MOSFET 10 and second MOSFET 12 may be configured to define different transfer characteristics. In some examples, first MOSFET 10 and second MOSFET 12 may be configured to define different SOAs. Moreover, in some examples, first MOSFET 10 and second MOSFET 12 may be configured to define different ZTCs.

In some examples, first MOSFET 10, for example, may be configured as a so-called linear FET that is configured to operate in a current limited, linear mode of operation, e.g., with operational characteristics similar to those of OptiMOS™ Linear FETs commercially available from Infineon Technologies AG headquartered in Neubiberg German. So-called linear FETs, for example, may combine a very low drain-to-source resistance ($R_{DS}ON$) with a wide SOA.

In contrast to first MOSFET 10, second MOSFET 12 may be configured as a power MOSFET or so-called "ON-FET" configured to operate in a non-linear mode of operation at low conduction losses. MOSFET 12, for example, may be configured with operational characteristics similar to those of power MOSFETs commercially available from Infineon Technologies AG headquartered in Neubiberg German. So-called power MOSFETs, for example, may comprise PROFET™ power MOSFETs, Automotive qualified OptiMOS™ power MOSFETs, CoolMOS™ superjunction MOSFETs, N-channel Power MOSFETs, P-Channel Power MOSFETs, small signal power MOSFETs, N-Channel Depletion Mode MOSFETs, dual MOSFETs, silicon carbide CoolSiC™ MOSFETS, or other types of power MOSFETS configured to operate as power switches or disconnect switches.

First MOSFET 10 and second MOSFET 12 are formed in the same semiconductor material, which may comprise silicon, silicon carbide, gallium nitride, or other semiconductor materials. Thus, in various examples, first MOSFET 10 and second MOSFET 12 may comprise silicon MOSFETs, gallium nitride MOSFETS, silicon carbide MOSFETS, or MOSFETs formed in another semiconductor material. Examples of MOSFETs may include, but are not limited to, PMOS, NMOS, DMOS, or any other type of MOSFET, or any combination of the same.

Second MOSFET 12 may be used as a power switch or disconnect switch for connecting power to a load. In such cases, however, there is often a DC link capacitor (also referred to as a "load capacitor"). The DC link capacitor may be connected to the load in order to provide more immediate power to the load when second MOSFET 12 is turned on. In these cases, a pre-charging routine may be performed with regard to the DC link capacitor to ensure that the DC link capacitor has sufficient charge prior to turn-on of second MOSFET 12. In some examples and as described in greater detail below, first MOSFET 10 may provide a useful mechanism for performing the pre-charging routine on the DC link capacitor, e.g., immediately prior to turn on of second MOSFET 12.

Figure 2:
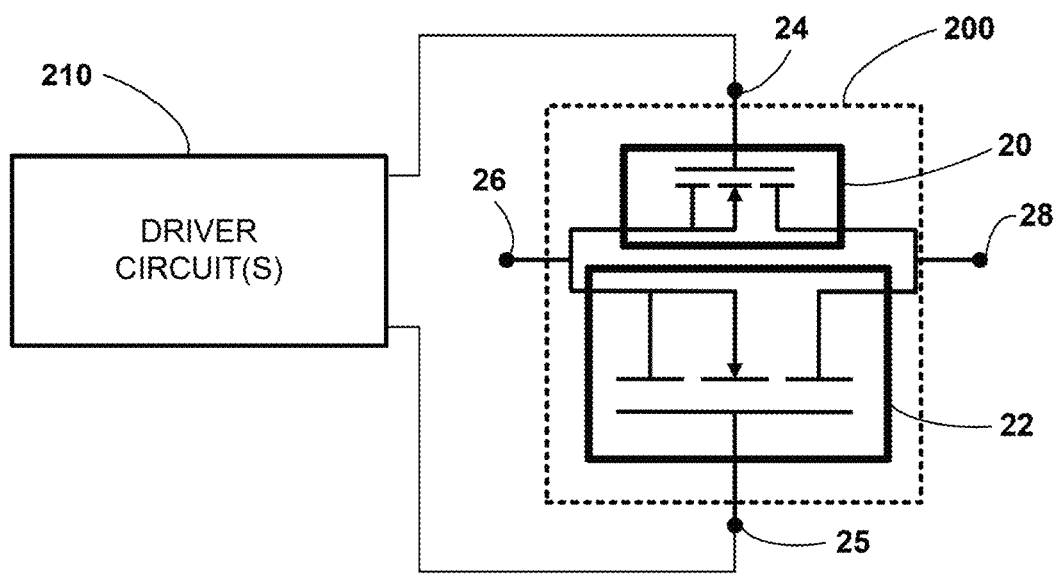
FIG. 2 is a diagram of an example circuit that includes one or more driver circuits connected to a dual gate metal oxide semiconductor field effect transistor (MOSFET) device.

FIG. 2 is a diagram of an example circuit that includes one or more driver circuit(s) 210 connected to a dual gate MOSFET device 200. Dual gate MOSFET device 200 may be similar to device 100 shown in FIG. 1. For example, dual gate MOSFET device 200 comprises a first MOSFET 20 formed in a semiconductor material, and a second MOSFET 22 formed in the same semiconductor material. First MOSFET 20 and second MOSFET 22 are arranged in parallel in the semiconductor material. Device 200 includes a first gate pin 24 associated with first MOSFET 20, wherein first gate pin 24 is connected to a gate node of first MOSFET 20. Device 200 further includes a second gate pin 25 associated with second MOSFET 22, wherein second gate pin 25 is connected to a gate node of second MOSFET 22.

In device 200, one or more drain conductors, e.g., one or more drain pins 28, are connected to a drain node of first MOSFET 20 and connected to a drain node of the second MOSFET 22. Thus, the drain node of first MOSFET 20 and the drain node of second MOSFET 22 comprise a common drain node in the semiconductor material, which is connected to drain pin(s) 28. Similarly, in device 200, one or more source conductors, e.g., source pin(s) 26, are connected to a source node of first MOSFET 20 and connected to a source node of second MOSFET 22. Thus, the source node of first MOSFET 20 and the source node of second MOSFET 22 comprise a common source node in the semiconductor material, which is connected to source pin(s) 26. Source pin(s) 26 may connect to a supply node and drain pin(s) 28 may connect to a load.

Again, according to this disclosure, first MOSFET 20 and second MOSFET 22 define different transfer characteristics. For example, first MOSFET 20 may be configured to operate in a linear mode of operation, and a second MOSFET 22 may be configured to operate in a non-linear mode of operation. In some examples, first MOSFET 20 and second MOSFET 22 may be configured to define different transfer characteristics. In some examples, first MOSFET 20 and second MOSFET 22 may be configured to define different SOAs. Moreover, in some examples, first MOSFET 20 and second MOSFET 22 may be configured to define different ZTCs. Second MOSFET 22 may be used as a power switch for delivering power to a load and for providing disconnect switch protection to the load, e.g., if power needs to be disconnected from the load. First MOSFET 20 may be used for a pre-charging routine on a capacitor that operates as a DC link capacitor for the load. These or other applications of device 200 may be useful.

Driver circuit(s) 210 may be configured to control the ON/OFF states first MOSFET 20 and second MOSFET 22 within dual gate MOSFET device 200. For example, driver circuit(s) 210 may be configured to control first MOSFET 20 via pulse width modulation scheme in a pre-charging routine applied to a DC link capacitor in order to charge the DC link capacitor in a quick and efficient manner. During the pre-charging routine using first MOSFET 20, driver circuit(s) 210 may control second MOSFET 22 to remain OFF and non-conductive. Following the pre-charging routine using first MOSFET 20, driver circuit(s) 210 may be configured to control second MOSFET 22 to turn on second MOSFET 22 in the presence of a pre-charged DC link capacitor. In this way, power can be delivered from a power supply, through second MOSFET 22 of dual gate MOSFET device 200, and to a load.

In some examples, driver circuit(s) 210 may be configured to ensure that first MOSFET 20 and second MOSFET 22 are never allowed to be turned on at the same time. In this way, operation of first MOSFET 20 and second MOSFET 22 is complementary. First MOSFET 20 may be used for a first function, e.g., a pre-charging routine on a DC link capacitor. Then, following the pre-charging routine, after first MOSFET 20 is turned off, second MOSFET 22 may be turned on to define a highly conductive current path to a load. In this case, a pre-charged DC link capacitor may improve ability to deliver current to the load through second MOSFET 22.

Figure 3:
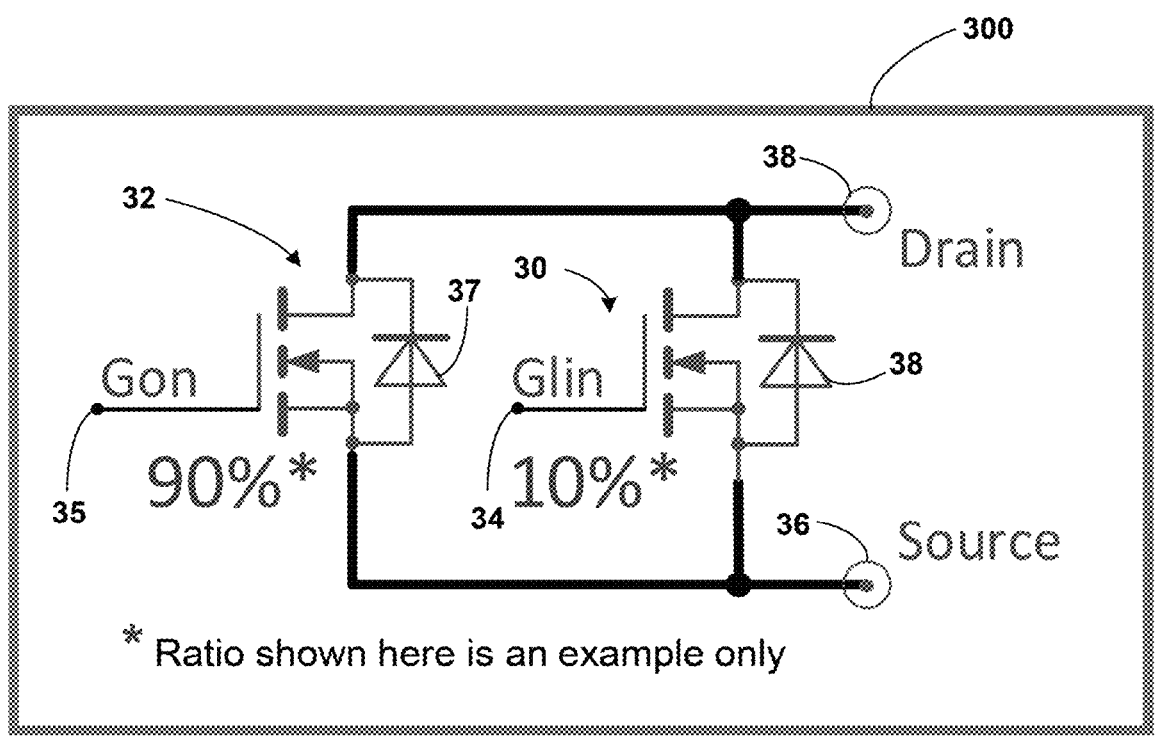
FIG. 3 is another a circuit diagram showing an example dual gate MOSFET device consistent with this disclosure.

FIG. 3 is another a circuit diagram showing an example dual gate MOSFET device consistent with this disclosure. Dual gate MOSFET device 300 may be similar to device 100 shown in FIG. 1 and similar to device 200 shown in FIG. 2. For example, dual gate MOSFET device 300 comprises a first MOSFET 30 formed in a semiconductor material, and a second MOSFET 32 formed in the same semiconductor material. First MOSFET 30 and second MOSFET 32 are arranged in parallel in the semiconductor material. First MOSFET 30 and second MOSFET 32 each include body diodes 37, 38, which are parasitic diodes formed in the fabrication of MOSFETs 30, 32.

Device 300 includes a first gate pin 34 associated with first MOSFET 30, wherein first gate pin 34 is connected to a gate node of first MOSFET 30. Device 300 further includes a second gate pin 35 associated with second MOSFET 32, wherein second gate pin 35 is connected to a gate node of second MOSFET 32.

In device 300, one or more drain conductors, e.g., one or more drain pins 38, are connected to a drain node of first MOSFET 30 and connected to a drain node of the second MOSFET 32. Thus, the drain node of first MOSFET 30 and the drain node of second MOSFET 32 comprise a common drain node in the semiconductor material, which is connected to drain pin(s) 38. Similarly, in device 300, one or more source conductors, e.g., source pin(s) 36, are connected to a source node of first MOSFET 30 and connected to a source node of second MOSFET 32. Thus, the source node of first MOSFET 30 and the source node of second MOSFET 32 comprise a common source node in the semiconductor material, which is connected to source pin(s) 36. Source pin(s) 36 may connect to a supply node and drain pin(s) 38 may connect to a load.

Similar to FIG. 1 and FIG. 2 described above, in the example illustrated in FIG. 3, first MOSFET 30 and second MOSFET 32 may define different transfer characteristics and may be used for different functions. For example, first MOSFET 30 may be configured to operate in a linear mode of operation, and a second MOSFET 32 may be configured to operate in a non-linear mode of operation. In some examples, first MOSFET 30 and second MOSFET 32 may be configured to define different transfer characteristics. In some examples, first MOSFET 30 and second MOSFET 32 may be configured to define different SOAs. Moreover, in some examples, first MOSFET 30 and second MOSFET 32 may be configured to define different ZTCs. Second MOSFET 32 may be used as a power switch for delivering power to a load and for providing disconnect switch protection to the load, e.g., if power needs to be disconnected from the load. First MOSFET 30 may be used for a pre-charging routine on a capacitor that operates as a DC link capacitor for the load. These or other applications of device 300 may be useful.

In the example shown in FIG. 3, a ratio is shown, whereby first MOSFET 30 comprises 10 percent of the surface area of semiconductor material associated with device 300 and second MOSFET 32 comprises 90 percent of the surface area of semiconductor material associated with device 300. However, this illustrated ratio is merely exemplary. More generally, referring to FIG. 1, 2, or 3, first MOSFET 10, 20, 30 may comprise less than 30 percent of a semiconductor area associated with the semiconductor material of device 100, 200, 300 and the second MOSFET 12, 22, 32 may comprise greater than 70 percent of the semiconductor area associated with the semiconductor material of device 100, 200 300. In some examples, first MOSFET 10, 20, 30 may comprise less than 15 percent of a semiconductor area associated with the semiconductor material of device 100, 200, 300 and second MOSFET 12, 22, 32 may comprise greater than 85 percent of the semiconductor area associated with the semiconductor material of device 100, 200 300. Furthermore, in some examples, first MOSFET 10, 20, 30 comprises less than 5 percent of the semiconductor area associated with the semiconductor material of device 100, 200, 300 and second MOSFET 12, 22, 32 comprises greater than 95 percent of the semiconductor area associated with the semiconductor material. Indeed, in some examples, first MOSFET 10, 20, 30 comprises approximately 3 percent of the semiconductor area associated with the semiconductor material of device 100, 200, 300 and second MOSFET 12, 22, 32 comprises approximately 97 percent of the semiconductor area associated with the semiconductor material of device 100, 200, 300.

One or more driver circuits (e.g., driver circuit(s) 210 of FIG. 2) may be configured to ensure that first MOSFET 10, 20, 30 and second MOSFET 12, 22, 32 are never turned on at the same time. In this way, operation of first MOSFET 10, 20, 30 and second MOSFET 12, 22, 32 is complementary. Since first MOSFET 10, 20, 30 and second MOSFET 12, 22, 32 are never turned on at the same time, the corresponding surface area associated with first MOSFET 10, 20, 30 may operate as a heat sink during ON-state operation of second MOSFET 12, 22, 32. Similarly, the corresponding surface area associated with second MOSFET 12, 22, 32 may operate as a heat sink during ON-state operation of second MOSFET 10, 20, 30. However, since second MOSFET 12, 22, 32 comprises substantially more surface area of device 100, 200, 300 relative to first MOSFET 10, 20, 30, the heat sinking capabilities of first MOSFET are more substantial than that of second MOSFET 12, 22, 32, which can enable or improve the linear operational performance of first MOSFET 10, 20, 30 relative to second MOSFET 12, 22, 32.

Figure 4:
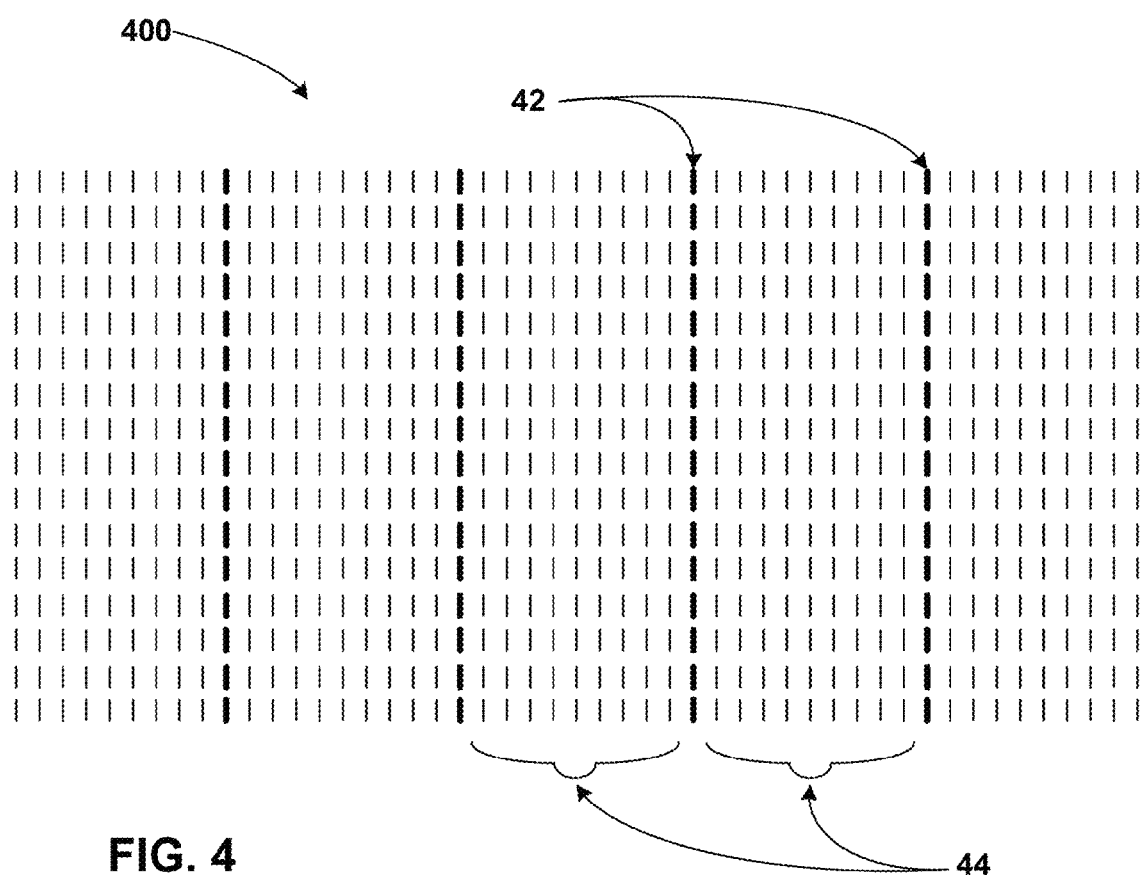
FIG. 4 is a conceptual diagram showing an example chip layout of semiconductor trenches consistent with dual gate MOSFET devices of with this disclosure

FIG. 4 is a conceptual diagram showing an example chip layout of semiconductor trenches consistent with dual gate MOSFET devices 100, 200, or 300 of with this disclosure. Device 400 of FIG. 4 may generally correspond to any of dual gate MOSFET devices 100, 200, or 300 shown in FIG. 1, 2, or 3. Bolded elements 42 correspond to so-called trenches, cells, or other elements that are fabricated in semiconductor material to define current paths associated with first MOSFET 10, 20, 30. Non-bolded elements 44 correspond to trenches, cells, or other elements fabricated in semiconductor material to define current paths associated with second MOSFET 12, 22, 32. The number of elements 44 and the chip surface area associated with elements 44 is greater than the volume and chip surface area associated with elements 42. The pitch (e.g., the distance left to right) between elements 44, for example may be approximately 1-5 microns. In contrast, the pitch between elements 42 (e.g., the distance left to right) between elements 42 may be approximately 10-50 microns. Transistors created for linear operation, e.g., so-called LIN-FETs may utilize substantial surface area of silicon for heat sinking capabilities. By reusing the area associated with elements 44 as a heat sink when operating a transistor associated with elements 42, device 400 can serve multiple purposes with an efficient use of semiconductor material. Elements 44 comprise cells or trenches associated with a second MOSFET that is configured as an ON-FET capable of delivering large amounts of current. The surface area associated with elements 44, however, may also operate as a heat sink for a first MOSFET associated with elements 42, which can achieve linear operational functionality for a first MOSFET. Again, one or more driver circuits may be configured to ensure that the first MOSFET and the second MOSFET are never operated in an ON state at the same time, which can preserve the complementary operation and complimentary heat sinking capabilities associated with the surface area of device 400.

Figure 5A:
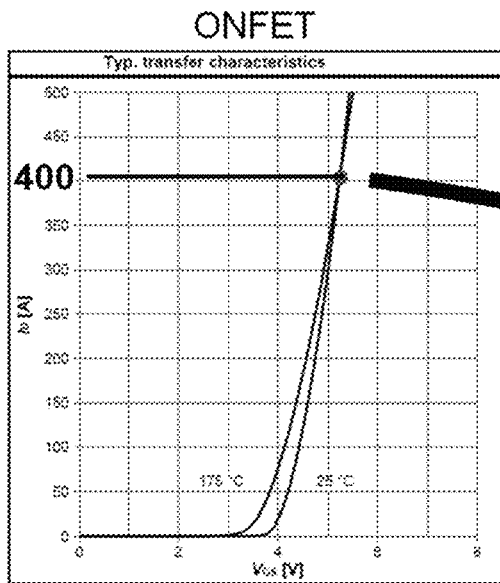
FIGS. 5A and 5B are graphs showing different exemplary transfer characteristics of two different transistors of a dual gate MOSFET device.
Figure 5B:
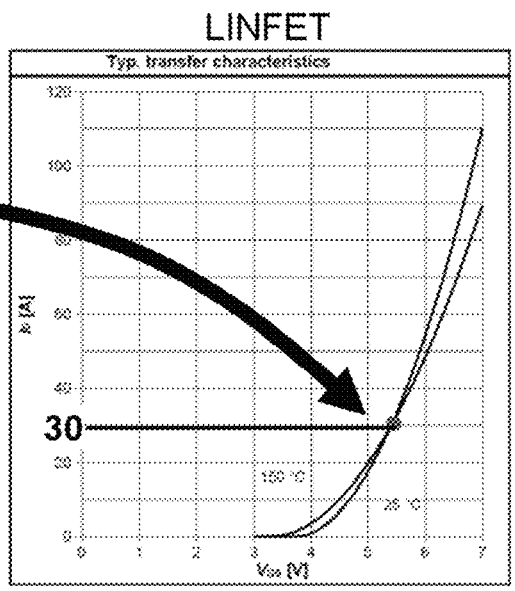

FIGS. 5A and 5B are graphs showing different exemplary transfer characteristics of two different transistors of a dual gate MOSFET device. FIG. 5A shows example transfer characteristics associated with a so-called ON-FET which may correspond to second MOSFET 12, 22, or 32 of device 100, 200, or 300. As shown in FIG. 5A, current rises very quickly (e.g., exponentially) as a function of gate to source voltage ($V_{GS}$) and as a function of different temperatures. In contrast, FIG. 5B shows example transfer characteristics associated with a so-called LIN-FET which may correspond to first MOSFET 10, 20, or 30 of device 100, 200, or 300. As shown in FIG. 5B, current rises more flat manner (relative to the example in FIG. 5A) as a function of gate to source voltage ($V_{GS}$) and as a function of different temperatures. In other words, the slope of the rise in current shown in FIG. 5B associated with first MOSFET 10, 20, 30 is flat relative to a steeper slope of current rise shown in FIG. 5A associated with second MOSFET 12, 22, 32. Moreover, the ZTCs associated with first MOSFET 10, 20, or 30 and with second MOSFET 12, 22, or 32 are different. As shown in 5B, for example, the ZTC associated with first MOSFET 10, 20, or 30 may be approximately 30 Amps. In contrast, as shown in FIG. 5A, the ZTC associated with second MOSFET 12, 22, or 32 may be approximately 400 Amps.

Figure 6A:
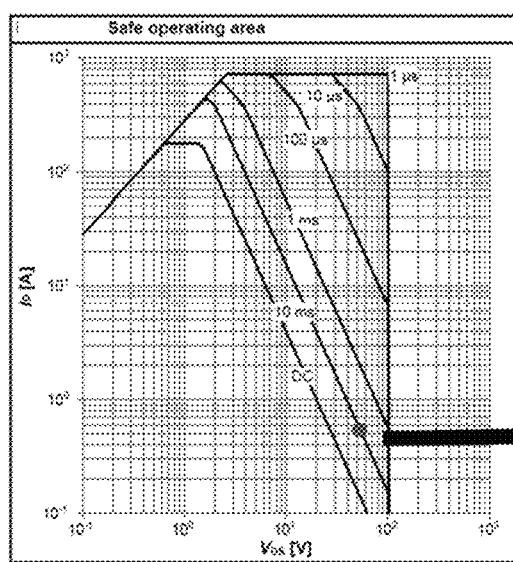
FIGS. 6A and 6B are graphs showing different exemplary safe operating areas (SOAs) of two different transistors of a dual gate MOSFET device.
Figure 6B:
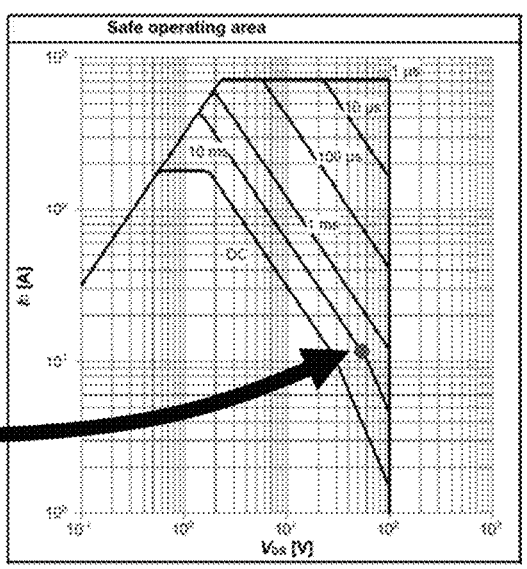

FIGS. 6A and 6B are graphs showing different exemplary SOAs of two different transistors of a dual gate MOSFET device. FIG. 6A shows example SOA associated with a so-called ON-FET which may correspond to second MOSFET 12, 22, or 32 of device 100, 200, or 300. In contrast, FIG. 6A shows example SOA associated with a so-called LIN-FET which may correspond to second MOSFET 10, 20, or 30 of device 100, 200, or 300. As can be seen FIG. 6B relative to FIG. 6A, the SOA associated with second MOSFET 10, 20, 30 is significantly larger than the SOA associated with first MOSFET 12, 22, 32, which may enable linear operation modes for first MOSFET 12, 22, 32 within its SOA.

In some examples, first MOSFEET 10, 20, 30 operates in a current-limited manner when operating above a drain-to-source voltage corresponding to the $R_{DS}ON$ of first MOSFET 10, 20, 30 and below a maximum drain-to-source voltage allowed for first MOSFEET 10, 20, 30. In this manner, using first MOSFET 10, 20, 30, current can be kept generally constant when operating above a drain-to-source voltage corresponding to the $R_{DS}ON$ of first MOSFEET 10, 20, 30 and below the maximum drain-to-source voltage allowed for first MOSFEET 10, 20, 30. Moreover, as described below, as the source voltage rises over time, e.g., due to charge on a DC link capacitor, first MOSFEET 10, 20, 30 can be controlled to have progressively longer duty cycles, without operating out of specification during a pre-charging routine on the DC link capacitor.

Figure 7:
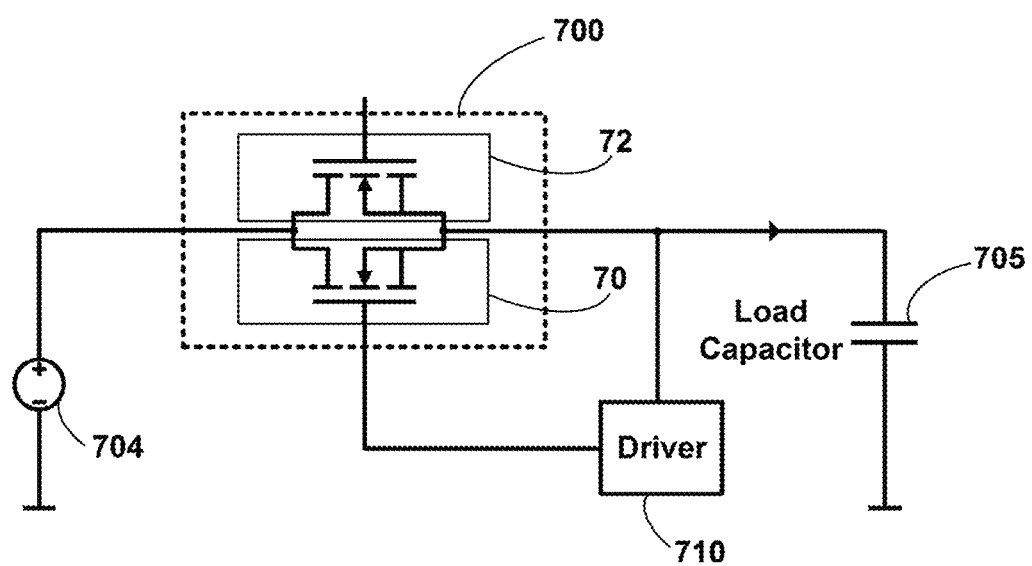
FIG. 7 is a diagram showing a circuit using a dual gate MOSFET device of this disclosure.

FIG. 7 is a diagram showing a circuit using a dual gate MOSFET device 700 of this disclosure. In particular, the circuit shown in FIG. 7 includes a power supply 704, such as a battery or collection of batteries, dual gate MOSFET device 700 configured to control the delivery of current from power supply 704 to a load, a load capacitor 705, and a driver circuit 710. Load capacitor 705 may correspond to a so-called DC link capacitor described above. Driver 710 may correspond to one or more driver circuits configured to control two separate MOSFETS 70, 72 of dual gate MOSFET device.

Dual gate MOSFET device 700 may be similar to device 100 shown in FIG. 1, device 200 shown in FIG. 2, or device 300 shown in FIG. 3. For example, dual gate MOSFET device 700 comprises a first MOSFET 70 formed in a semiconductor material, and a second MOSFET 72 formed in the same semiconductor material. First MOSFET 70 and second MOSFET 72 are arranged in parallel in the semiconductor material.

The drain node of first MOSFET 70 and the drain node of second MOSFET 72 comprise a common drain node in the semiconductor material of device 700. Moreover, the source node of first MOSFET 70 and the source node of second MOSFET 72 comprise a common source node in the semiconductor material of device 700.

Driver 710 may be configured to control first MOSFET 70 and second MOSFET 72 based on gate voltage signals delivered to the gates of first MOSFET 70 and second MOSFET 72. Similar to the examples described above, for example, driver 710 may be configured to ensure that first MOSFET 70 and second MOSFET 72 are never turned on at the same time. In this way, operation of first MOSFET 70 and second MOSFET 72 is complementary. First MOSFET 70 may be used for a pre-charging routine on load capacitor 705, which again may comprise a so-called DC link capacitor. Then, following the pre-charging routine, after first MOSFET 70 is turned off, driver 710 may be configured to turn on second MOSFET 72 to define a highly conductive current path to a load in the presence of pre-charge on load capacitor. In this case, a pre-charged load capacitor 705 may improve ability to deliver current to the load through second MOSFET 72.

Driver 710, for example, may perform a pre-charging routine on load capacitor 705 that includes controlling first MOSFET 70 via pulse modulation (PM) signals. PM signals may refer to pulse width modulation (PWM) signals, pulse duration modulation signals, pulse density modulation signals or other pulsed signals used to control transistors. In some examples, driver 710 may be configured to deliver pulse widths that increase over time during the pre-charging routine. For example, as charge accumulates on load capacitor 705 during the pre-charging routine, the charge on load capacitor 705 reduces the drain to source voltage associated with first MOSFET 70. Therefore, to achieve more efficiency and faster charging of load capacitor 705, a PM charging scheme may define pulse widths that increase over the time associated with the pre-charging routine. In some examples, driver 710 defines pulse widths that increase linearly over time during the pre-charging routine. In some examples, driver 710 defines pulse widths that increase parabolically over time during the pre-charging routine. In general, driver 710 can be configured control first MOSFET 70 such that energy delivered to load capacitor 705 increases over time. In some examples, driver 710 can increase the energy delivered to load capacitor 705 over time by increasing pulse widths of gate signals to first MOSFET 70 over time. However, in other examples, driver 710 could keep pulse widths constant while increasing current delivered through MOSFET 70, in which case, driver 710 may include access to one or more additional current sources.

To achieve desirable fast charging of load capacitor 705, it may be desirable to operate first MOSFET 70 as close as possible to the maximum allowed temperature rise (e.g., a temperature rise threshold) defined for first MOSFET 70 (e.g., which may correspond to approximately 60 Kelvin in illustrative example). Operating first MOSFET 70 as close as possible to the maximum allowed temperature rise during the pre-charging routine can help accelerate the pre-charging and also achieve turn on of second MOSFET 72 as fast as possible and in the presence of the necessary pre-charge on load capacitor 705.

In some examples, driver 710 modulates the pulse widths associated with first MOSFET 70 such that a temperature rise of first MOSFET 70 during each of the PM signals does not exceed a temperature rise threshold. Again, in some cases the pulse widths associated with first MOSFET 70 increase linearly over time during the pre-charging routine. In other cases, the pulse widths associated with first MOSFET 70 increase parabolically (or possibly exponentially) over time during the pre-charging routine. If parameters (e.g., current, voltage, and or temperature measurements) are available for first MOSFET 70, then driver 710 may be configured to increase pulse widths increase over time during the pre-charging routine based on one or more measured parameters associated with first MOSFET. Also, as noted above, to increase energy without adjusting pulse widths, driver 710 could also be configured to controlling first MOSFET 70 so as to create increasing current levels through first MOSFET 70 over time during the pre-charging routine.

A dual gate MOSFET device 700 of this disclosure, for example, may eliminate the need for a separate pre-charge circuit for charging load capacitor 700. Current limitations can be achieved by linear operation of a first MOSFET 70 and pulsing (e.g., PWM control) using first MOSFET 70 part of a dual gate MOSFET device 700. Accurate adjustment of current limits can be achieved via $V_{GS}$, due to the minimized transconductance of first MOSFET 70 (e.g., lower sensitivity dID/dVGS relative to second MOSFET 72). The term dID/dVGS may define the transconductance of a MOSFET, which may correspond to the instantaneous slope of current at a given point along the transfer function lines shown in FIG. 5A or 5B. Second MOSFET 12, 22, 32, 72 can be turned on in steady state operation following the pre-charging routine and after first MOSFET 70 is turned off, (which minimized losses due to low $R_{DS}ON$), when load capacitor 705 is charged. $R_{DS}ON$ refers to the drain-to-source resistance of the MOSFET when the MOSFET is in the ON state.

Pulse width modulation control of first MOSFET 70 can be desirable since power dissipation reduces as capacitor voltage increases on load capacitor 705 (e.g., drain-source voltage reduces as load capacitor 705 charges). Thus, driver 701 can increase pulse widths for first MOSFET 70 with rising capacitor voltage on load capacitor 705 to accelerate the charging process and exploit allowed self-heating. In some examples, pulse modulation control of first MOSFET 70 during the pre-charging may be based on time to provide a simple fixed charging pattern. Also, in some examples, pulse modulation control of first MOSFET 70 during the pre-charging may be based voltage, in which case the drain-to-source voltage of first MOSFET 70 may be sensed by an analog-to-digital converter (ADC) or other measurement circuit. Moreover, in some examples, modulation control of first MOSFET 70 during the pre-charging may be based on power, (in which case the drain-to-source voltage of first MOSFET 70 may be sensed by an ADC or other voltage measurement circuit and current through of first MOSFET 70 may be sensed by a shunt resistor or another current measurement circuit.

In one example, driver circuit 710 is configured to perform linear modulation of first MOSFET 70 that is dependent on time according to the following equation 1:

$$D(t) = \frac{D_{end} - D_{start}}{T_{pulse} \cdot n_{pulse}} \cdot t + D_{start}$$

where D(t) represents the duty cycle at time t, $D_{end}$ represents a final duty cycle of a last pulse, $D_{start}$ represents an initial duty cycle at a start time (e.g., time=0), $T_{pulse}$ represents a switching period, $n_{pulse}$ represents at total number of pulses, and t represents time.

In another example, driver circuit 710 is configured to perform parabolic modulation of first MOSFET 70 that is dependent on time according to the following equation 2:

$$D(t) = \frac{D_{end} - D_{start}}{(T_{pulse} \cdot n_{pulse})^2} \cdot t^2 + D_{start}$$

where D(t) represents the duty cycle at time t, $D_{end}$ represents a final duty cycle of a last pulse, $D_{start}$ represents an initial duty cycle at a start time (e.g., time=0), $T_{pulse}$ represents a switching period, $n_{pulse}$ represents at total number of pulses, and t represents time.

In many situations, a dual gate MOSFET device of this disclosure that includes a first MOSFET and a second MOSFET arranged in parallel may be paired with another MOSFET, e.g., a third MOSFET. In this case, the third MOSFET (i.e., a separate device) and the second MOSFET of the dual gate MOSFET device are positioned in an anti-series configuration so as to form a bi-directional switch. Moreover, it could also be the case where DC link capacitors are used on both sides of transistor devices, e.g., on both the load side and the supply side, in which case two dual gate MOSFET devices of this disclosure could be arranged in an anti-series configuration so as to form a bi-directional switch with linear pre-charging capabilities in both directions.

Figure 8:
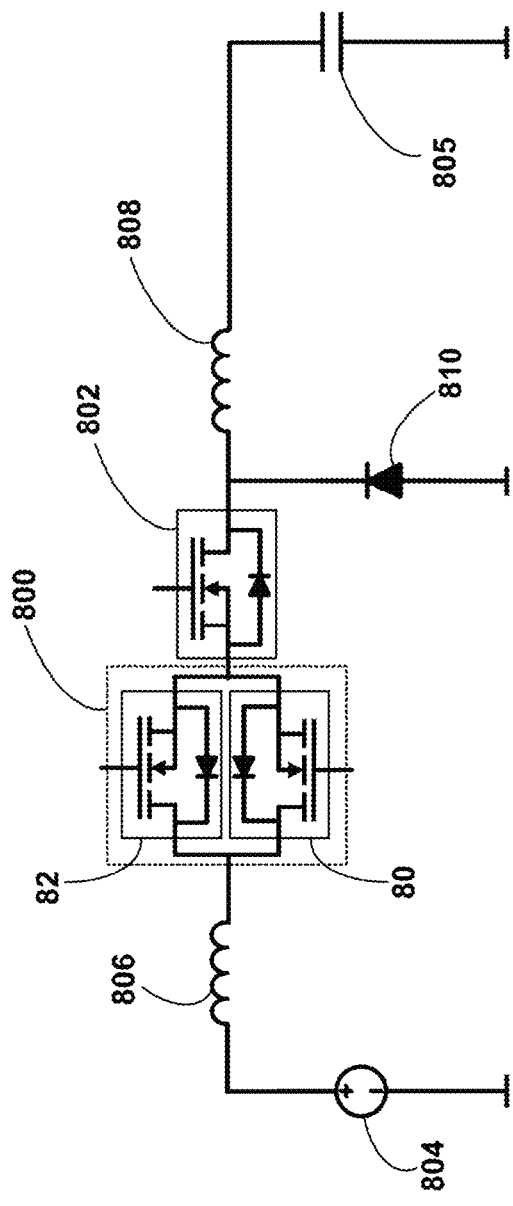
FIG. 8 is a diagram showing another circuit using a dual gate MOSFET device of this disclosure.

FIG. 8 is a diagram showing another circuit using a dual gate MOSFET device 800 of this disclosure. FIG. 8 is similar to FIG. 7 in many respects. The circuit shown in FIG. 7 includes a power supply 804, such as a battery or collection of batteries, an inductor 806 which correspond to an inductor circuit or may correspond to parasitics that create inductance on the supply side. Capacitor 805 may correspond to a so-called DC link capacitor described above. Inductor 808 may correspond to an inductor circuit or may correspond to parasitics that create inductance on the load side. Freewheeling diode 810 may also be included on the load side and positioned in parallel with capacitor 805.

Similar to the examples above, dual gate MOSFET device 800 may be configured to control the delivery of current from power supply 804 to a load, and dual gate MOSFET may include a first MOSFET 80 and a second MOSFET 82 arranged in parallel within device 800. In this case, however, the circuit shown in FIG. 8 further includes another MOSFET, e.g., third MOSFET 802, which may comprise a separate device formed in a separate semiconductor relative to dual gate MOSFET device 800.

Dual gate MOSFET device 800 may be similar to device 100 shown in FIG. 1, device 200 shown in FIG. 2, or device 300 shown in FIG. 3. For example, dual gate MOSFET device 800 comprises a first MOSFET 80 formed in a semiconductor material, and a second MOSFET 82 formed in the same semiconductor material. Third MOSFET 802 comprises a separate device formed in a separate semiconductor relative to dual gate MOSFET device 800. Third MOSFET 802 and second MOSFET 82 are positioned in an anti-series configuration so as to form a bi-directional switch. Again, although not illustrated in FIG. 8, it could also be the case where DC link capacitors are used on both sides of transistor devices, e.g., capacitor 805 on the load side and yet another DC link capacitor (not shown) the supply side associated with battery 804. In this case, it may be desirable to include two dual gate MOSFET devices of this disclosure, arranged in an anti-series configuration so as to form a bi-directional switch with linear pre-charging capabilities in both directions. These and other uses and circuit configurations may achieve benefits form a dual gate MOSFET device design as described herein.

In general, methods according to this disclosure may be applied by one or more driver circuits (such as driver circuit 210 or driver 710) in order to control operation of a dual gate MOSFET device as described herein. The method may include controlling the dual gate MOSFET device formed in a semiconductor material, the dual gate MOSFET device including a first MOSFET formed in the semiconductor material, and a second MOSFET formed in the semiconductor material, wherein the first MOSFET and the second MOSFET are arranged in parallel in the semiconductor material, wherein the first MOSFET and the second MOSFET include a common drain node and a common source node, and wherein the first MOSFET and the second MOSFET define different transfer characteristics. For example, controlling the dual gate MOSFET includes controlling, via one or more driver circuits, first gate voltage signals to a first gate associated with the first MOSFET, and controlling, via the one or more driver circuits, second gate voltage signals to a second gate associated with the second MOSFET.

Figure 9:
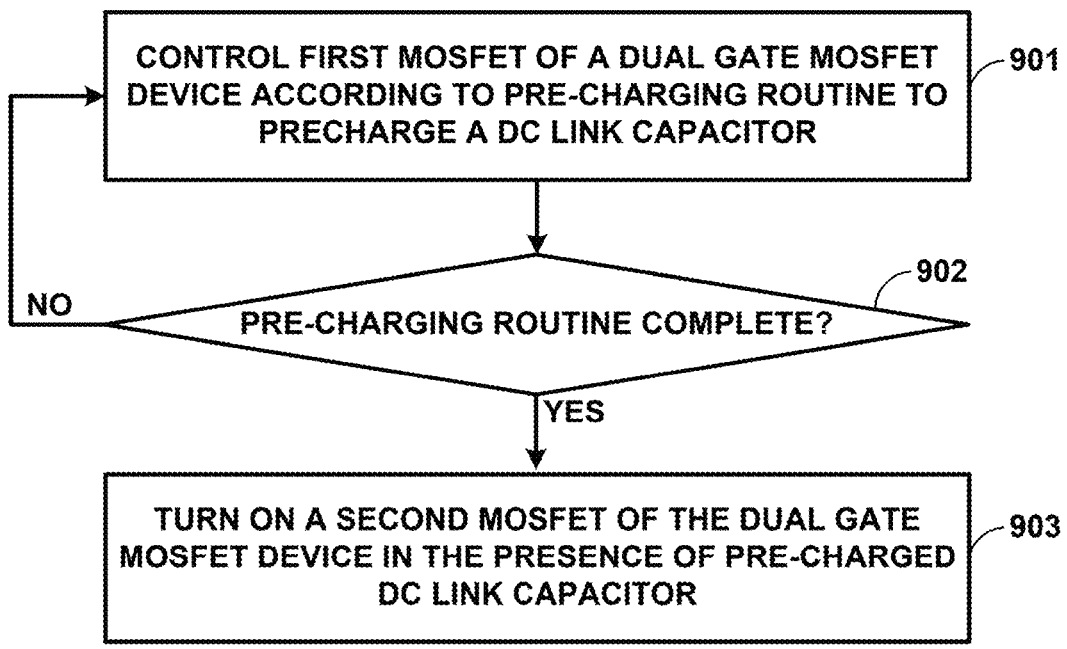
FIG. 9 is a flow diagram illustrating a method of charging a DC link capacitor using a circuit that includes a dual gate MOSFET device of this disclosure.

Consistent with the method set forth above, FIG. 9 is a flow diagram illustrating a more specific method of charging a DC link capacitor using a circuit that includes a dual gate MOSFET device of this disclosure. By way of example, the method shown in FIG. 9 will be described from the perspective of driver circuit 210 or driver 710, although other driver circuits could apply the method. As shown in FIG. 9, one or more driver circuits 210, 710 control a first MOSFET 20, 70 of a dual gate MOSFET device 200, 700 according to a pre-charging routine to pre-charge a DC link capacitor (901). The DC link capacitor, for example, may correspond to load capacitor 705 shown in FIG. 7. Then, following the pre-charging routine (yes branch of 902), the one or more driver circuits 210, 710 control a second MOSFET 22, 72 to turn on the second MOSFET of the dual gate MOSFET device 200, 700 in the presence of a pre-charge on the DC link capacitor (903).

The pre-charging routine mentioned in FIG. 9 may comprise controlling first MOSFET 20, 70 via PM signals with pulse widths that increase over time during the pre-charging routine. In some examples, the pulse widths increase linearly over time during the pre-charging routine, such as according to Equation 1 described above. In some examples the pulse widths increase parabolically over time during the pre-charging routine, such as according to Equation 2 described above. In some examples, the pulse widths are modulated such that a temperature rise of the first MOSFET during each of the PM signals does not exceed a temperature rise threshold. In yet another alternative to the use of PM signals, the pre-charging routine may alternatively comprise controlling first MOSFET 20, 70 so as to create increasing current levels through first MOSFET over time during the pre-charging routine.

The following clauses may illustrate one or more aspects of the disclosure.

Clause 1—A device comprising: a first MOSFET formed in a semiconductor material; a second MOSFET formed in the semiconductor material, wherein the first MOSFET and the second MOSFET are arranged in parallel in the semiconductor material; a first gate pin associated with the first MOSFET, wherein the first gate pin is connected to a gate node of the first MOSFET; a second gate pin associated with the second MOSFET, wherein the second gate pin is connected to a gate node of the second MOSFET; one or more drain conductors connected to a drain node of the first MOSFET and connected to a drain node of the second MOSFET, wherein the drain node of the first MOSFET and the drain node of the second MOSFET comprise a common drain node in the semiconductor material; and one or more source conductors connected to a source node of the first MOSFET and connected to a source node of the second MOSFET, wherein the source node of the first MOSFET and the source node of the second MOSFET comprise a common source node in the semiconductor material, wherein the first MOSFET and the second MOSFET define different transfer characteristics.

Clause 2—The device of clause 1, wherein first MOSFET and the second MOSFET define different SOAs.

Clause 3—The device of clause 1 or 2, wherein the first MOSFET is configured to operate in a linear mode of operation, and the second MOSFET is configured to operate in a non-linear mode of operation.

Clause 4—The device of any of clauses 1-3, wherein first MOSFET and the second MOSFET define different ZTCs.

Clause 5—The device of any of clauses 1-4, wherein the first MOSFET comprises less than 30 percent of a semiconductor area associated with the semiconductor material and the second MOSFET comprises greater than 70 percent of the semiconductor area associated with the semiconductor material.

Clause 6—The device of any of clauses 1-5, wherein first MOSFET comprises less than 15 percent of the semiconductor area associated with the semiconductor material and the second MOSFET comprises between greater than 85 percent of the semiconductor area associated with the semiconductor material.

Clause 7—The device of any of clauses 1-6, wherein the first MOSFET comprises less than 5 percent of the semiconductor area associated with the semiconductor material and the second MOSFET comprises greater than 95 percent of the semiconductor area associated with the semiconductor material.

Clause 8—A circuit comprising: a dual gate metal oxide semiconductor field effect transistor (MOSFET) device formed in a semiconductor material, the dual gate MOSFET device including a first MOSFET formed in the semiconductor material, and a second MOSFET formed in the semiconductor material, wherein the first MOSFET and the second MOSFET are arranged in parallel in the semiconductor material, wherein the first MOSFET and the second MOSFET include a common drain node and a common source node, and wherein the first MOSFET and the second MOSFET define different transfer characteristics; and one or more driver circuits configured to control the first MOSFET and the second MOSFET based on gate voltage signals.

Clause 9—The circuit of clause 8, further comprising a DC link capacitor, wherein one or more driver circuits are configured to control the first MOSFET according to a pre-charging routine to pre-charge the DC link capacitor.

Clause 10—The circuit of clause 9, wherein following the pre-charging routine, the one or more driver circuits are configured to control the second MOSFET to turn on the second MOSFET in the presence of the pre-charge on the DC link capacitor.

Clause 11—The circuit of clause 9 or 10, wherein the pre-charging routine includes controlling the first MOSFET via PM signals with pulse widths that increase over time during the pre-charging routine.

Clause 12—The circuit of any of clause 11, wherein the pulse widths are modulated such that a temperature rise of the first MOSFET during each of the PM signals does not exceed a temperature rise threshold.

Clause 13—The circuit of clause 11 or 12, wherein the pulse widths increase linearly over time during the pre-charging routine.

Clause 14—The circuit of clause 11 or 12, wherein the pulse widths increase parabolically over time during the pre-charging routine.

Clause 15—The circuit of any of clauses 11-14, wherein the pulse widths increase over time during the pre-charging routine based on one or more measured parameters associated with the first MOSFET.

Clause 16—The circuit of clause 9, wherein the pre-charging routine includes controlling the first MOSFET so as to create increasing current levels through first MOSFET over time during the pre-charging routine.

Clause 17—The circuit of any of clauses 8-16, further comprising another MOSFET device that includes a third MOSFET, wherein the third MOSFET and the second MOSFET are positioned in an anti-series configuration so as to form a bi-directional switch.

Clause 18—A method comprising: controlling a dual gate MOSFET device formed in a semiconductor material, the dual gate MOSFET device including a first MOSFET formed in the semiconductor material, and a second MOSFET formed in the semiconductor material, wherein the first MOSFET and the second MOSFET are arranged in parallel in the semiconductor material, wherein the first MOSFET and the second MOSFET include a common drain node and a common source node, and wherein the first MOSFET and the second MOSFET define different transfer characteristics.

Clause 19—The method of clause 18, wherein controlling the dual gate MOSFET includes: controlling first gate voltage signals to a first gate associated with the first MOSFET; and controlling second gate voltage signals to a second gate associated with the second MOSFET.

Clause 20—The method of clause 18 or 19, wherein controlling the dual gate MOSFET includes: controlling the first MOSFET according to a pre-charging routine associated with a DC link capacitor; and following the pre-charging routine, controlling the second MOSFET to turn on the second MOSFET in the presence of a pre-charge on the DC link capacitor.

Clause 21—The method of clause 20, wherein the pre-charging routine includes controlling the first MOSFET via PM signals with pulse widths that increase over time during the pre-charging routine.

Clause 22—The method of clause 21, wherein the pulse widths increase linearly over time during the pre-charging routine.

Clause 23—The method of clause 21, wherein the pulse widths increase parabolically over time during the pre-charging routine.

Clause 24—The method of any of clauses 21-23, wherein the pulse widths are modulated such that a temperature rise of the first MOSFET during each of the PM signals does not exceed a temperature rise threshold.

Clause 25—The method of clause 20, wherein the pre-charging routine includes controlling the first MOSFET so as to create increasing current levels through first MOSFET over time during the pre-charging routine.

Various devices, circuits, methods, and features have been described in this disclosure. These and other devices, circuits, methods and features are within the scope of the following claims.

The invention claimed is:
1. A circuit comprising:
a dual gate metal oxide semiconductor field effect transistor (MOSFET) device formed in a semiconductor material, the dual gate MOSFET device including a first MOSFET formed in the semiconductor material, and a second MOSFET formed in the semiconductor material, wherein the first MOSFET and the second MOSFET are arranged in parallel in the semiconductor material, wherein the first MOSFET and the second MOSFET include a common drain node and a common source node, and wherein the first MOSFET and the second MOSFET define different transfer characteristics;
one or more driver circuits configured to control the first MOSFET and the second MOSFET based on gate voltage signals; and
a direct current (DC) link capacitor associated with an electric vehicle or another high-voltage operated system, wherein one or more driver circuits are configured to control the first MOSFET to operate in a linear mode of operation in a current-limited manner according to a pre-charging routine to pre-charge the DC link capacitor associated with the electric vehicle or the another high-voltage operated system,
wherein following the pre-charging routine, the one or more driver circuits are configured to control the second MOSFET to turn on the second MOSFET to operate in a non-linear mode of operation and define a highly conductive current path in the presence of the pre-charge on the DC link capacitor,
wherein the pre-charging routine to pre-charge the DC link capacitor includes controlling the first MOSFET so as to create increasing energy delivered to the DC link capacitor over time during the pre-charging routine.

2. The circuit of claim 1, wherein the pre-charging routine includes controlling the first MOSFET via pulse modulation (PM) signals with pulse widths that increase over time during the pre-charging routine.

3. The circuit of claim 2, wherein the pulse widths are modulated such that a temperature rise of the first MOSFET during each of the PM signals does not exceed a temperature rise threshold.

4. The circuit of claim 2, wherein the pulse widths increase linearly over time during the pre-charging routine.

5. The circuit of claim 2, wherein the pulse widths increase parabolically over time during the pre-charging routine.

6. The circuit of claim 2, wherein the pulse widths increase over time during the pre-charging routine based on one or more measured parameters associated with the first MOSFET.

7. The circuit of claim 1, wherein the pre-charging routine includes controlling the first MOSFET so as to create increasing current levels through first MOSFET over time during the pre-charging routine.

8. The circuit of claim 1, further comprising another MOSFET device that includes a third MOSFET, wherein the third MOSFET and the second MOSFET are positioned in an anti-series configuration so as to form a bi-directional switch.

9. The circuit of claim 1, wherein the first MOSFET and the second MOSFET define different safe operating areas (SOAs), wherein the first MOSFET is configured to operate in a linear mode of operation, and the second MOSFET is configured to operate in a non-linear mode of operation, wherein the first MOSFET and the second MOSFET define different Zero Temperature Coefficients (ZTCs), and wherein the first MOSFET comprises less than 30 percent of a semiconductor area associated with the semiconductor material and the second MOSFET comprises greater than 70 percent of the semiconductor area associated with the semiconductor material.

10. The circuit of claim 9, wherein the first MOSFET comprises less than 15 percent of the semiconductor area associated with the semiconductor material and the second MOSFET comprises greater than 85 percent of the semiconductor area associated with the semiconductor material.

11. The circuit of claim 10, wherein the first MOSFET comprises less than 5 percent of the semiconductor area associated with the semiconductor material and the second MOSFET comprises greater than 95 percent of the semiconductor area associated with the semiconductor material.

12. The circuit of claim 1, wherein the dual gate MOSFET device is configured to operate within a safe operating area (SOA) at voltages greater than 6 volts and amperages greater than 1 amp.

13. The circuit of claim 1, wherein the first MOSFET comprises a first plurality of current paths formed in a semiconductor area, and the second MOSFET comprises a second plurality of current paths formed in the semiconductor area.

14. A method comprising:
controlling a dual gate metal oxide semiconductor field effect transistor (MOSFET) device formed in a semiconductor material, the dual gate MOSFET device including a first MOSFET formed in the semiconductor material, and a second MOSFET formed in the semiconductor material, wherein the first MOSFET and the second MOSFET are arranged in parallel in the semiconductor material, wherein the first MOSFET and the second MOSFET include a common drain node and a common source node, and wherein the first MOSFET and the second MOSFET define different transfer characteristics, wherein controlling the dual gate MOSFET includes:
controlling the first MOSFET according to a pre-charging routine associated with a direct current (DC) link capacitor associated with an electric vehicle or another high-voltage operated system, wherein the pre-charging routine to pre-charge the DC link capacitor includes controlling the first MOSFET to operate in a linear mode of operation in a current-limited manner so as to create increasing energy delivered to the DC link capacitor over time during the pre-charging routine; and
following the pre-charging routine, controlling the second MOSFET to turn on the second MOSFET to operate in a non-linear mode of operation and define a highly conductive current path in the presence of a pre-charge on the DC link capacitor.

15. The method of claim 14, wherein controlling the dual gate MOSFET includes:
controlling first gate voltage signals to a first gate associated with the first MOSFET; and
controlling second gate voltage signals to a second gate associated with the second MOSFET.

16. The method of claim 14, wherein the pre-charging routine includes controlling the first MOSFET via pulse modulation (PM) signals with pulse widths that increase over time during the pre-charging routine.

17. The method of claim 16, wherein the pulse widths increase linearly over time during the pre-charging routine.

18. The method of claim 16, wherein the pulse widths increase parabolically over time during the pre-charging routine.

19. The method of claim 16, wherein the pulse widths are modulated such that a temperature rise of the first MOSFET during each of the PM signals does not exceed a temperature rise threshold.

20. The method of claim 14, wherein the pre-charging routine includes controlling the first MOSFET so as to create increasing current levels through first MOSFET over time during the pre-charging routine.

21. The method of claim 14, wherein the first MOSFET and the second MOSFET define different safe operating areas (SOAs), wherein the first MOSFET is configured to operate in a linear mode of operation, and the second MOSFET is configured to operate in a non-linear mode of operation, wherein the first MOSFET and the second MOSFET define different Zero Temperature Coefficients (ZTCs), and wherein the first MOSFET comprises less than 30 percent of a semiconductor area associated with the semiconductor material and the second MOSFET comprises greater than 70 percent of the semiconductor area associated with the semiconductor material.

22. The method of claim 14, wherein the dual gate MOSFET device is configured to operate within a safe operating area (SOA) at voltages greater than 6 volts and amperages greater than 1 amp.

23. The method of claim 14, wherein the first MOSFET comprises a first plurality of current paths formed in a semiconductor area, and the second MOSFET comprises a second plurality of current paths formed in the semiconductor area.

\* \* \* \* \*